United States Patent
Shiroshita

(10) Patent No.: US 9,295,154 B2
(45) Date of Patent: Mar. 22, 2016

(54) WIRING BOARD

(71) Applicant: KYOCERA SLC Technologies Corporation, Yasu-shi, Shiga (JP)

(72) Inventor: Makoto Shiroshita, Otsu (JP)

(73) Assignee: KYOCERA CIRCUIT SOLUTIONS, INC., Kyoto (JP)

( * ) Notice: Subject to any disclaimer, the term of this patent is extended or adjusted under 35 U.S.C. 154(b) by 0 days.

(21) Appl. No.: 14/317,657

(22) Filed: Jun. 27, 2014

(65) Prior Publication Data

US 2015/0000965 A1   Jan. 1, 2015

(30) Foreign Application Priority Data

Jun. 28, 2013 (JP) .................. 2013-135843
Jun. 28, 2013 (JP) .................. 2013-135844
Jul. 31, 2013 (JP) .................. 2013-158706

(51) Int. Cl.
*H05K 1/00* (2006.01)
*H05K 1/11* (2006.01)
*H01L 23/498* (2006.01)
*H05K 1/02* (2006.01)

(52) U.S. Cl.
CPC .......... *H05K 1/113* (2013.01); *H01L 23/49816* (2013.01); *H01L 23/49822* (2013.01); *H01L 23/49827* (2013.01); *H01L 2224/131* (2013.01); *H01L 2224/81193* (2013.01); *H05K 1/025* (2013.01); *H05K 2201/0175* (2013.01); *H05K 2201/0317* (2013.01); *H05K 2201/0338* (2013.01); *H05K 2201/10674* (2013.01)

(58) Field of Classification Search
CPC ............ H05K 1/0216; H05K 1/113; H05K 2201/0317; H05K 2201/0338; H05K 2201/0175; H05K 2201/10674; H05K 1/025; H01L 23/49816; H01L 23/49822; H01L 23/49827; H01L 2224/81193
USPC .................. 174/250–268; 361/760, 792–795; 257/778

See application file for complete search history.

(56) References Cited

U.S. PATENT DOCUMENTS

| | | | | |
|---|---|---|---|---|
| 8,426,742 | B2 * | 4/2013 | Ejiri | .......... C23C 18/1651 174/126.2 |
| 2003/0127747 | A1 * | 7/2003 | Kajiwara | .......... H01L 24/02 257/778 |
| 2011/0156272 | A1 * | 6/2011 | Maeda | .......... H01L 23/49811 257/774 |
| 2013/0075145 | A1 * | 3/2013 | Kaneko | .......... H05K 1/113 174/262 |

FOREIGN PATENT DOCUMENTS

JP   2013-045938 A   3/2013

* cited by examiner

*Primary Examiner* — Ishwarbhai B Patel
(74) *Attorney, Agent, or Firm* — Volpe and Koenig, P.C.

(57) ABSTRACT

A wiring board according to the present invention is provided with an insulating board and a connection pad, wherein the connection pad includes a main conductor layer formed of a low resistance material, a thin film resistor layer formed of a high resistance material and having a low soldering wettability, and a covering layer having a high soldering wettability, the main conductor layer, the thin film resistor layer, and the covering layer being sequentially laminated at the surface of the insulating layer in such a manner as to be electrically connected in series to each other, and the thin film resistor layer covers a main surface and a side surface of the main conductor layer, and further, a side surface of the thin film resistor layer is exposed from the covering layer.

3 Claims, 4 Drawing Sheets

200

WIRING BOARD

BACKGROUND OF THE INVENTION

1. Field of the Invention

The present invention relates to a wiring board for mounting a semiconductor element or the like such as a semiconductor integrated circuit device.

2. Description of Related Art

A built-up wiring board is used as a wiring board used for mounting a semiconductor element such as a semiconductor integrated circuit device. For example, a plurality of insulating layers and a plurality of copper-plated layers are laminated on a core layer, thereby forming the built-up wiring board.

At an upper surface of the wiring board, semiconductor element connection pads connected to electrodes of the semiconductor element are arranged in a lattice pattern. In contrast, at a lower surface of the wiring board, external connection pads connected to an external electric circuit board are arranged in a lattice pattern. The semiconductor element connection pads and the external connection pads are electrically connected to each other via wiring conductors. A solder bump for joining the electrode of the semiconductor element to the semiconductor element connection pads is welded onto the semiconductor element connection pads.

In the above-described wiring board, the semiconductor element is mounted at the upper surface of the wiring board such that each of the electrodes for the semiconductor element abuts against the corresponding solder bump, and further, these members are heated such that the solder bump is melted, so that the solder bump is joined to the electrode of the semiconductor element, thus mounting the semiconductor element on the wiring board.

In the above-described wiring board, the characteristic impedance of a signal wiring conductor for propagating a signal is set to about 50Ω in the case of a single end signal whereas about 100Ω in the case of a difference signal in order to suppress damping of a signal to the minimum. In contrast, the input impedance of the semiconductor element is several hundred megohms or more whereas the output impedance thereof ranges from several ohms to several tens of ohms, and therefore, the characteristic impedance of the semiconductor element is markedly different from the characteristic impedance of the wiring conductor. For this reason, in the case where a high-speed signal is transmitted to or received from the semiconductor element through the signal wiring conductor, noise having a reflection wave overlapping an input/output terminal occurs at the signal transmitted through the signal wiring conductor. As a result, there has arisen a problem that the noise inhibits the semiconductor element from being normally operated.

In view of this, in order to solve the above-described problem, as shown in FIGS. 7 and 8, there has been proposed a wiring board including a semiconductor element connection pad 13, in which the following layers are laminated in sequence on an insulating layer 11b: a main conductor layer 13a containing a low resistance material having a volume resistivity of 100 μΩ·cm or less; a resistor layer 13b containing a high resistance material having a volume resistivity of 10 Ω·cm or more; and a coating layer 13c having a high soldering wettability, wherein the main conductor layer 13a, the resistor layer 13b, and the coating layer 13c are electrically connected in series to each other. FIG. 8 shows a wiring board, in which a solder resist layer 19 is formed on the insulating layer 11b shown in FIG. 7 (e.g., Japanese Unexamined Patent Application No. 2013-45938).

The resistor layer 13b electrically connected in series to the main conductor layer 13a forms a damping resistance, which can damp noise caused by a difference in characteristic impedance between the wiring conductor and the semiconductor element so as to normally actuate the semiconductor element. The semiconductor element connection pad 13 is connected to the wiring conductor at the lower layer via a via conductor 12b containing a low resistance material integrally connected to the lower surface of the main conductor layer 13a and having a volume resistivity of 100 μΩ·cm or less.

However, the resistor layer 13b formed between the main conductor layer 13a and the coating layer 13c is as thin as 100 nm to 1000 nm, and therefore, the melted solder bump strides over the resistor layer 13b between the main conductor layer 13a and the coating layer 13c at the side surface of the connection pad, thereby possibly inducing short-circuiting. In this manner, if short-circuiting occurs, the function of the damping resistance cannot effectively act, resulting in the fear that noise caused by the difference in characteristic impedance between the wiring conductor and the semiconductor element cannot be damped, so that the semiconductor element cannot be normally actuated.

SUMMARY OF THE INVENTION

An object of the present invention is to provide a wiring board, in which, in a thin film resistor layer forming a connection pad electrically connected to a via conductor or the connection pad, a damping resistance formed by the thin film resistor layer electrically connected in series to a main conductor layer is made to effectively act so as to damp noise caused by a difference in characteristic impedance between a wiring conductor and a semiconductor element, thus normally actuating the semiconductor element.

A first aspect of the present invention provides a wiring board including: an insulating board having an insulating layer at a surface thereof, the insulating layer having a via hole bored thereat; a via conductor formed inside the via hole and containing a low resistance material having a volume resistivity of 100 μΩ·cm or less; and a connection pad formed at the surface of the insulating layer and including a thin film resistor layer containing a high resistance material having a volume resistivity of 10 Ω·cm or more, wherein the thin film resistor layer is adhered to the insulating layer in such a manner as to cover the via conductor and the insulating layer surrounding the via conductor.

A second aspect of the present invention provides a wiring board including: an insulating board having an insulating layer at a surface thereof; and a connection pad formed at a surface of the insulating layer, wherein the connection pad includes a main conductor layer formed of a low resistance material having a volume resistivity of 100 μΩ·cm or less, a thin film resistor layer formed of a high resistance material having a volume resistivity of 10 Ω·cm or more and having a low soldering wettability, and a covering layer having a high soldering wettability, the main conductor layer, the thin film resistor layer, and the covering layer being sequentially laminated at the surface of the insulating layer in such a manner as to be electrically connected in series to each other; and the thin film resistor layer covers a main surface of the main conductor layer, and further, the main surface periphery of the thin film resistor layer is exposed from the covering layer.

According to a third aspect of the present invention, a wiring board includes: an insulating board having an insulating layer at a surface thereof; and a connection pad formed at a surface of the insulating layer, wherein the connection pad includes a main conductor layer formed of a low resistance material having a volume resistivity of 100 μΩ·cm or less, a thin film resistor layer formed of a high resistance material having a volume resistivity of 10 Ω·cm or more and having a low soldering wettability, and a covering layer having a high soldering wettability, the main conductor layer, the thin film resistor layer, and the covering layer being sequentially laminated at the surface of the insulating layer in such a manner as to be electrically connected in series to each other; and the thin film resistor layer covers a main surface and a side surface of the main conductor layer, and further, a side surface of the thin film resistor layer is exposed from the covering layer.

According to the first aspect of the present invention, the connection pad including the thin film resistor layer containing the high resistance material is adhered to the surface of the insulating layer in such a manner as to cover the via conductor and the insulating layer surrounding the via conductor. Thus, even in the case where the thin film resistor layer is as thin as 100 nm to 1000 nm, it is possible to prevent the solder bump melted on the connection pad from reaching the via conductor across the thin film resistor layer and short-circuiting from occurring.

Consequently, there can be provided the wiring board, which allows the damping resistance provided by the thin film resistor layer connected to the via conductor to effectively act, thus damping noise caused by a difference in characteristic impedance between the wiring conductor and the semiconductor element, so as to normally actuate the semiconductor element.

According to the second aspect of the present invention, the thin film resistor layer is formed in such a manner as to cover the main surface of the main conductor layer, and further, such that the main surface periphery of the thin film resistor layer is exposed from the covering layer. Therefore, even in the case where the thin film resistor layer formed between the main conductor layer and the covering layer is as thin as 100 nm to 1000 nm, the portion covering the main surface periphery of the main conductor layer of the thin film resistor layer having a low soldering wettability is exposed from the covering layer, thus making it possible to suppress the flow of the solder bump welded onto the covering layer over other portions from the covering layer. As a consequence, it is possible to prevent any occurrence of short-circuiting between the main conductor layer and the covering layer.

According to the third aspect of the present invention, the thin film resistor layer is formed in such a manner as to cover the main surface and side surface of the main conductor layer, and further, to expose the side surface of the thin film resistor layer from the covering layer. Thus, even in the case where the thin film resistor layer formed between the main conductor layer and the covering layer is as thin as 100 nm to 1000 nm, it is possible to prevent occurrence of short-circuiting between the main conductor layer and the covering layer.

Hence, according to the second and third aspects of the present invention, it is possible to provide the wiring board which allows the damping resistance provided by the thin film resistor layer electrically connected in series to the main conductor layer to effectively act, thus damping noise caused by the difference in characteristic impedance between the wiring conductor and the semiconductor element, so as to normally actuate the semiconductor element.

DETAILED DESCRIPTION OF PREFERRED EMBODIMENTS

Figure 1:
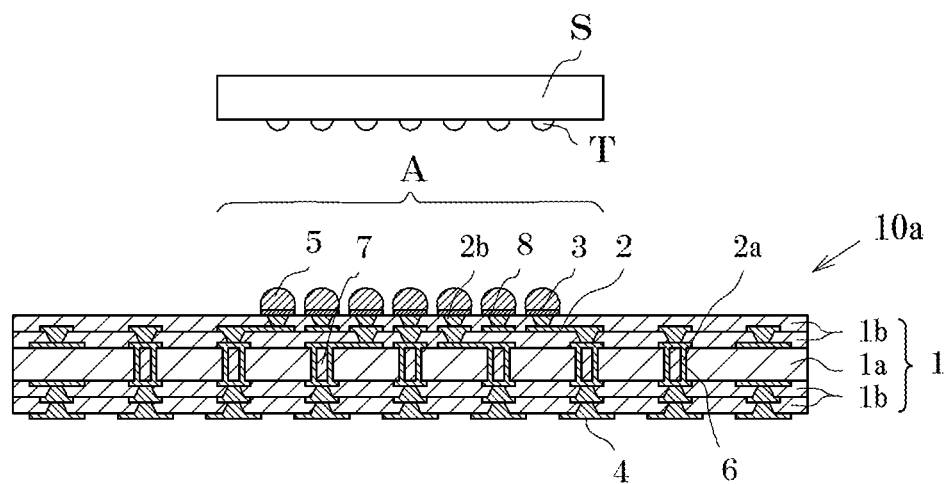
FIG. 1 is a cross-sectional view schematically showing one embodiment of a wiring board according to a first aspect of the present invention.
Figure 2:
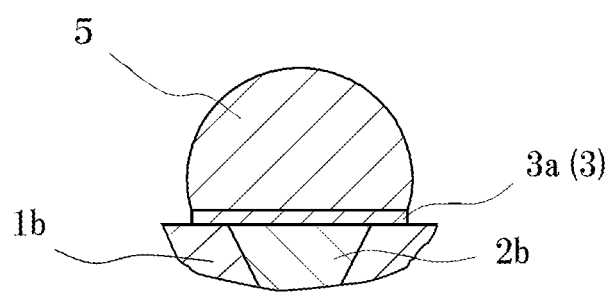
FIG. 2 is an enlarged, cross-sectional view showing a set of a solder bump and a semiconductor element connection pad on the wiring board shown in FIG. 1.

Next, one embodiment of a wiring board according to a first aspect of the present invention will be described with reference to FIGS. 1 and 2. FIG. 1 is a cross-sectional view schematically showing a wiring board 10a, and FIG. 2 is an enlarged, cross-sectional view showing a set of a solder bump and a semiconductor element connection pad on the wiring board shown in FIG. 1. The wiring board 10a shown in FIG. 1 is provided with mainly an insulating board 1, a wiring conductor 2, a semiconductor element connection pad 3, an external connection pad 4, and a solder bump 5.

The insulating board 1 is formed by laminating two insulating layers 1b, each of which contains a thermosetting resin, on upper and lower surfaces of a core layer 1a formed by impregnating glass fiber in the thermosetting resin, respectively. At the center of the upper surface of the insulating board 1, there is formed a mounting portion A on which a semiconductor element S is mounted. At the mounting portion A, there are formed the semiconductor element connection pads 3, to each of which an electrode T of the semiconductor element S is electrically connected. At the lower surface of the insulating board 1, there is formed the external connection pad 4 that is electrically connected to an external electric circuit board. The stripe-shaped or solid wiring conductors 2 for electrically connecting the semiconductor element connection pads 3 to the external connection pads 4, respectively, are disposed from the upper surface to the lower surface in the insulating board 1. The stripe-shaped wiring conductor 2 is used for a signal whereas the solid wiring conductor 2 is used for a ground or a power source. Moreover, the solder bump 5 is welded to the semiconductor element connection pad 3.

In the wiring board 10a, the semiconductor element S is mounted at the upper surface of the wiring board 10a such that the electrodes T of the semiconductor element S abut against the corresponding solder bumps 5, respectively. After the mounting, the wiring board 10a is heated by, for example, a heater up to about 260° C. so as to melt the solder bump 5. In this manner, the solder bump 5 and the electrode T of the semiconductor element S are joined to each other, whereby the semiconductor element S is mounted on the wiring board 10a.

The core layer 1a is an insulating core member for the wiring board 10a. The member is formed by impregnating, for example, glass fiber in a thermosetting resin such as an epoxy resin or a bismaleimide triazine resin. The core layer 1a has a thickness of, for example, about 0.3 mm to 1.5 mm, and further, has a plurality of through-holes 6, each having a diameter of about 0.1 mm to 1 mm from its upper surface to its lower surface. A part of the wiring conductor 2 is adhered to upper and lower surfaces and the inner surface of each of the through-holes 6. A part of the wiring conductor 2 adhering to the inner surface of each of the through-holes 6 functions as a through-hole conductor 2a. The wiring conductors 2 at the upper and lower surfaces are electrically connected to each other via the through-hole conductor 2a.

In core layer 1a, the through-holes 6 are formed after an insulating sheet obtained by impregnating glass fiber in an uncured thermosetting resin is subjected to thermosetting. That is, the above-described core layer 1a is obtained by drilling or blasting in order to form the through-hole 6 from the upper surface to the lower surface of a cured insulating sheet. The wiring conductors 2 at the upper and lower surfaces of the core layer 1a are formed in a predetermined pattern by sticking a copper foil in a thickness of about 3 µm to 50 µm over the entire upper and lower surfaces of the insulating sheet for the core layer 1a, and further, etching the copper foil after curing the sheet. The through-hole conductor 2a is formed by forming the through-hole 6 in the core layer 1a, and then, depositing, for example, a copper-plated film. Specifically, a copper-plated film may be deposited in a thickness of about 3 µm to 50 µm by electrodeless plating or electrolytic plating at the inner surface of the through-hole 6.

Furthermore, in the core layer 1a, the through-hole 6 is filled with a hole filling resin 7 contained a thermosetting resin such as an epoxy resin. The through-hole 6 is filled with the hole filling resin 7, thereby forming the wiring conductors 2 and the insulating layers 1b immediately above and immediately below the through-hole 6, respectively.

The insulating layers 1b laminated at the upper and lower surfaces of the core layer 1a, respectively, are formed of the thermosetting resin such as an epoxy resin or a bismaleimide triazine resin. The thickness of each of the insulating layers 1b is about 10 µm to 60 µm. There are provided a plurality of via holes 8, each having a diameter of about 20 µm to 100 µm from the upper surface thereof to the lower surface thereof. A part of the wiring conductor 2 is adhered to surface of each of the insulating layers 1b and the inner surface of each of the via holes 8. A part of the wiring conductor 2 adhering to the inner surface of each of the via holes 8 functions as a via conductor 2b. The wiring conductors 2 at each of the insulating layers 1b are electrically connected to each other via the via conductors 2b.

The above-described insulating layer 1b is formed by sticking an insulating film formed of an uncured thermosetting resin having a thickness of about 10 µm to 60 µm onto the upper and lower surfaces of the core layer 1a, followed by thermosetting, boring the via hole 8 by laser processing, and sequentially laminating the next insulating layer 1b thereon in the same manner. The wiring conductor 2 adhering to the surface of each of the insulating layers 1b and the inner surface of the via hole 8 is formed of, for example, a copper-plated film. Specifically, every time each of the insulating layers 1b is formed, a copper-plated film having a thickness of about 5 µm to 25 µm is simply deposited at the surface of each of the insulating layers 1b and the inner surface of the via hole 8 by a well-known semi-additive process or the like.

The semiconductor element connection pad 3 formed on the mounting portion A at the upper surface of the insulating board 1 is formed into a circle having a diameter of about 50 µm to 150 µm. The numerous semiconductor element connection pads 3 are arranged in a lattice pattern in a pitch of about 100 µm to 250 µm in a region within the mounting portion A. The above-described semiconductor element connection pads 3 function as terminals for electrically connecting the electrodes T of the semiconductor element S to the wiring conductors 2, and are formed on the via conductors 2b formed on the uppermost insulating layer 1b.

Moreover, the external connection pad 4 formed at the lower surface of the insulating board 1 is formed into a circle having a diameter of about 200 µm to 700 µm. The numerous external connection pads 4 are arranged in a lattice pattern in a pitch of about 500 µm to 1000 µm in substantially the entire region at the lower surface of the insulating board 1. The external connection pad 4 functions as a terminal for electrically connecting the wiring conductor 2 to the external electric circuit board, and is formed of a part of the wiring conductor 2 formed on the lowermost insulating layer 1b.

The solder bump 5 welded to the semiconductor element connection pad 3 contains lead-free solder such as a tin-silver alloy or a tin-silver-copper alloy, and functions as a connecting member for electrically connecting the semiconductor element connection pad 3 to the electrode T of the semiconductor element S. The solder bump 5 is heated and melted in the state in which the electrode T of the semiconductor element S is brought into contact with the solder bump 5, so that the semiconductor element connection pad 3 and the electrode T of the semiconductor element S are electrically connected to each other via the solder bump 5.

As shown in FIG. 2, in the wiring board 10a according to the first aspect of the present invention, a thin film resistor layer 3a containing a high resistance material forming the semiconductor element connection pad 3 is adhered to the insulating layer 1b in such a manner as to cover the via conductor 2b and the insulating layer 1b surrounding the via conductor 2b.

The via conductor 2b is formed of the same material as that of the wiring conductor 2, that is, a low resistance material having a volume resistivity of 100 µΩ·cm or less. If the volume resistivity of the via conductor 2b is more than 100 µΩ·cm, the electric resistance of the wiring conductor 2 becomes high, and therefore, a signal is markedly damped in the wiring conductor 2 for a signal. In addition, in the wiring conductor 2 for a ground or a power source, a power source potential to be supplied to the semiconductor element S is reduced. Consequently, it is preferable that the volume resistivity of the via conductor 2b is 100 µΩ·cm or less.

Examples of the low resistance materials include copper, silver, gold, nickel, and aluminum. Among these materials, copper is preferred from the viewpoints of machinability, economy, and the like. In the case where the via conductor 2b is formed of, for example, copper, the via conductor 2b may be formed by the same semi-additive process as the wiring conductor 2.

The thin film resistor layer 3a contains a high resistance material having a volume resistivity of 10 Ω·cm or more and has a thickness of about 100 nm to 1000 nm. The thin film resistor layer 3a functions as a damping resistance, thereby damping noise caused by a difference in characteristic impedance between the wiring conductor 2 and the semiconductor element S so as to enable the semiconductor element S to be normally actuated. If the volume resistivity of the thin film resistor layer 3a is less than 10 Ω·cm, it is difficult to apply a resistance to the thin film resistor layer 3a as the damping resistance. Consequently, it is preferable that the volume resistivity of the thin film resistor layer 3a is 10 Ω·cm or more.

Examples of high resistance materials include semiconductors such as germanium or silicon, or compound semiconductors such as gallium arsenide, gallium phosphide, cadmium sulfide, silicon germanium, indium phosphide, and ferrite. Among these materials, germanium is preferred from the viewpoints of machinability and magnetic permeability. If the thickness of the thin film resistor layer 3a is less than 100 nm or more than 1000 nm, it is difficult to apply a resistance required for the damping resistance to the thin film resistor layer 3a. Consequently, the thin film resistor layer 3a preferably has the thickness of 100 nm to 1000 nm. In order to form the thin film resistor layer 3a in the case where the thin film resistor layer 3a is formed of, for example, germanium, the exposed main surface of the via conductor 2b and the surface of the insulating layer surrounding the via conductor 2b are simply covered with the germanium thin film in a thickness of, preferably, 100 nm to 1000 nm by well-known sputtering or vapor deposition.

With the above-described configuration, in the wiring board 10a according to the first aspect of the present invention, the surface of the insulating layer 1b remains covered with the thin film resistor layer 3a containing the high resistance material forming the semiconductor element connection pad 3 in such a manner as to cover the via conductor 2b and the insulating layer 1b surrounding the via conductor 2b. Thus, even in the case where the thin film resistor layer 3a is as thin as 100 nm to 1000 nm, it is possible to prevent the solder bump 5 melted on the thin film resistor layer 3a (i.e., the semiconductor element connection pad 3) from reaching the via conductor 2b across the thin film resistor layer 3a and short-circuiting from occurring.

Consequently, a damping resistance provided by the thin film resistor layer 3a connected to the via conductor 2b can effectively act, so that it is possible to damp noise caused by the difference in characteristic impedance between the wiring conductor 2 and the semiconductor element S even in the case where a high-speed signal is transmitted to or received from the semiconductor element S through the wiring conductor for a signal out of the wiring conductors 2. Thus, it is possible to provide the wiring board 10a capable of normally actuating the semiconductor element S.

Figure 3:
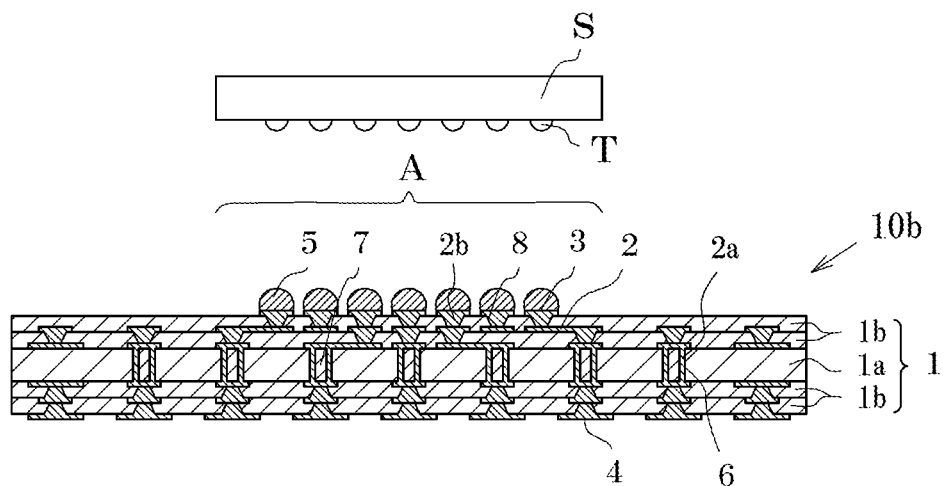
FIG. 3 is a cross-sectional view schematically showing one embodiment of a wiring board according to a second aspect of the present invention.
Figure 4:
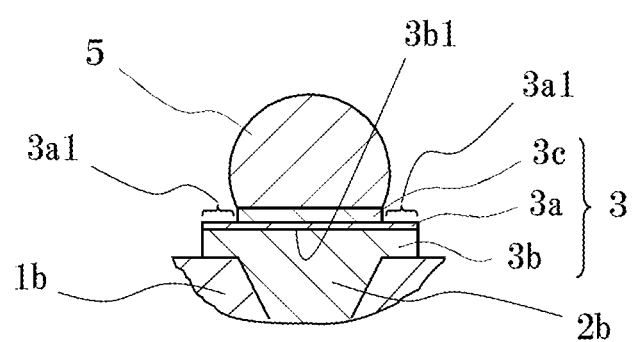
FIG. 4 is an enlarged, cross-sectional view showing a set of a solder bump and a semiconductor element connection pad on the wiring board shown in FIG. 3.

Next, one embodiment of a wiring board according to a second aspect of the present invention will be described with reference to FIGS. 3 and 4. FIG. 3 is a cross-sectional view schematically showing a wiring board 10b, and FIG. 4 is an enlarged, cross-sectional view showing a set of a solder bump and a semiconductor element connection pad on the wiring board shown in FIG. 3. The same constituent elements in the wiring board 10b shown in FIGS. 3 and 4 as those in the wiring board 10a shown in FIGS. 1 and 2 are designated by the same reference characters, and therefore, their description will be omitted.

In the wiring board 10b shown in FIG. 3, a semiconductor element connection pad 3 is formed of a part of a wiring conductor 2 formed on an uppermost insulating layer 1b. Specifically, as shown in FIG. 4, the semiconductor element connection pad 3 is structured such that a main conductor layer 3b, a thin film resistor layer 3a, and a covering layer 3c are sequentially laminated in such a manner as to be electrically connected in series. The thin film resistor layer 3a covers the main surface 3b1 of the main conductor layer 3b, and further, is exposed at a main surface periphery 3a1 of the thin film resistor layer 3a from the covering layer 3c. The width of the periphery 3a1 is preferably 10 μm or more. If the width is less than 10 μm, the effect of suppression of a flow of a solder bump welded onto the covering layer 3c over other portions from the covering layer 3c is reduced.

The main conductor layer 3b is formed of the same material as that of the wiring conductor 2, and further, containing a low resistance material having a volume resistivity of 100 μΩ·cm or less. The thickness of the main conductor layer 3b is about 5 μm to 25 μm. If the volume resistivity of the main conductor layer 3b is more than 100 μΩ·cm, the electric resistance of the wiring conductor 2 becomes high, and further, a signal is markedly damped in the wiring conductor 2 for a signal. In addition, in the wiring conductor 2 for a ground or a power source, a power source potential to be supplied to the semiconductor element S is reduced. Consequently, it is preferable that the volume resistivity of the main conductor layer 3b is 100 μΩ·cm or less.

Examples of the low resistance materials include copper, silver, gold, nickel, and aluminum. Among these materials, copper is preferred from the viewpoints of machinability, economy, and the like. In the case where the main conductor layer 3b is formed of, for example, copper, the main conductor layer 3b may be formed by the same semi-additive process as the wiring conductor 2.

The covering layer 3c contains a lower resistance material having a high soldering wettability, and has a thickness of about 1 μm to 10 μm. The covering layer 3c is adapted to achieve favorable connection to a solder bump 5. If the thickness of the covering layer 3c is less than 1 μm, it is difficult to achieve satisfactorily favorable connection to the solder bump 5. In contrast, if the thickness of the covering layer 3c is more than 10 μm, the semiconductor element connection pad 3 provided with the covering layer 3c becomes too higher than other semiconductor element connection pads 3, and thus it is difficult to favorably connect an electrode T of the semiconductor element S to all of the semiconductor element connection pads 3 via the solder bumps 5. For this reason, the covering layer 3c preferably has the thickness of 1 μm to 10 μm.

Examples of the low resistance material forming the covering layer 3c include copper, nickel, gold, and palladium. Among these materials, copper is preferred from the viewpoints of machinability, economy, and the like. A method for forming the covering layer 3c may be employed the following methods. In the case where the covering layer 3c is formed of, for example, copper, the side surface of the main conductor layer 3b and the main surface periphery 3a1 and side surface of the thin film resistor layer 3a are masked. Subsequently, a thin film containing copper is formed in a thickness of about 0.05 μm to 0.5 μm at the main surface of the thin film resistor layer 3a exposed from a mask by well-known sputtering, and then, an electrolytic copper-plated layer is deposited on the thin film.

The details of the thin film resistor layer 3a are described above, and therefore, its description will be omitted here. The thin film resistor layer 3a formed on the wiring board according to the second aspect of the present invention has a low soldering wettability. Incidentally, in the case where the thin film resistor layer 3a is formed of, for example, germanium in the wiring board 10b, the exposed main surface of the main conductor layer 3b is simply covered with a germanium thin film in a thickness of, preferably, 100 nm to 1000 nm by well-known sputtering or vapor deposition.

With the above-described configuration, in the wiring board 10b according to the second aspect of the present invention, the semiconductor element connection pad 3 includes, at the surface of the insulating layer 1b, the main conductor layer 3b containing the low resistance material, the thin film resistor layer 3a containing the high resistance material and having a low soldering wettability, and the covering layer 3c having a high soldering wettability, wherein they are electrically connected in series to each other. Moreover, the thin film resistor layer 3a covers the main surface 3b1 of the main conductor layer 3b, and further, the main surface periphery 3a1 of the thin film resistor layer 3a is formed in such a manner as to be exposed from the covering layer 3c. Thus, even in the case where the thin film resistor layer 3a formed between the main conductor layer 3b and the covering layer 3c is as thin as 100 nm to 1000 nm, the main surface periphery 3a1 formed of the thin film resistor layer 3a having the low soldering wettability is exposed from the covering layer 3c, and therefore, it is possible to suppress the flow of the solder bump 5 melted on, for example, the covering layer 3c from the covering layer 3c. Thus, it is possible to prevent the occurrence of short-circuiting between the main conductor layer 3b and the covering layer 3c.

Consequently, a damping resistance provided by the thin film resistor layer 3a electrically connected in series to the main conductor layer 3b can effectively act, so that it is possible to damp noise caused by the difference in characteristic impedance between the wiring conductor 2 and the semiconductor element S even in the case where a high-speed signal is transmitted to or received from the semiconductor element S through the wiring conductor for a signal out of the wiring conductors 2. Thus, it is possible to provide the wiring board 10b capable of normally actuating the semiconductor element S.

Figure 5:
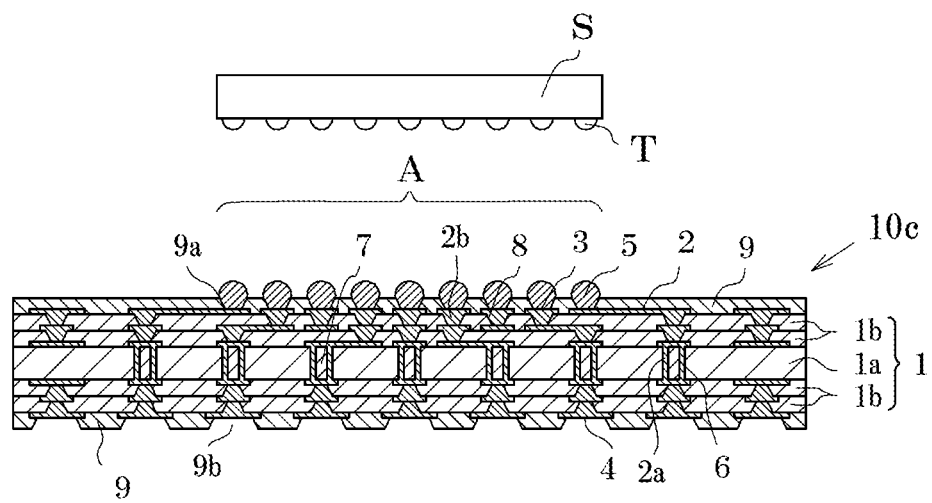
FIG. 5 is a cross-sectional view schematically showing one embodiment of a wiring board according to a third aspect of the present invention.
Figure 6:
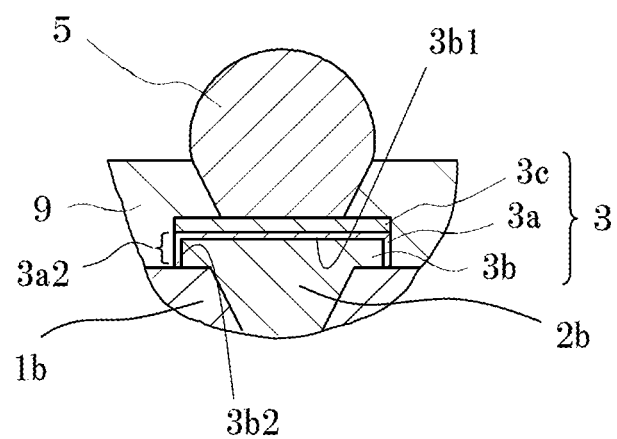
FIG. 6 is an enlarged, cross-sectional view showing a set of a solder bump and a semiconductor element connection pad on the wiring board shown in FIG. 5.
Figure 7:
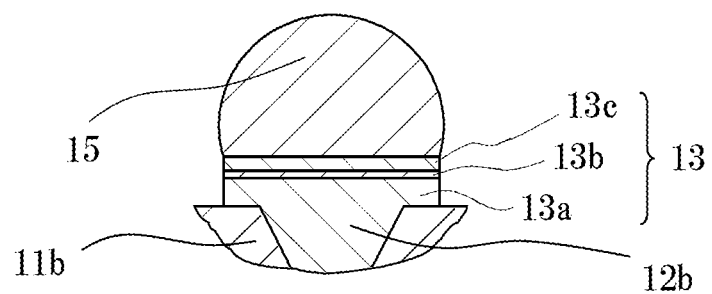
FIG. 7 is an enlarged, cross-sectional view showing a set of a solder bump and a semiconductor element connection pad on a conventional wiring board.
Figure 8:
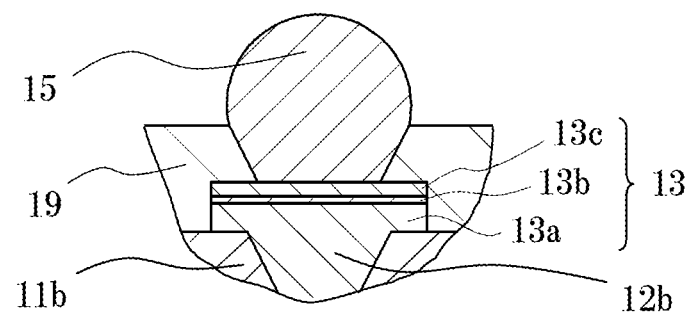
FIG. 8 is an enlarged, cross-sectional view showing a set of a solder bump and a semiconductor element connection pad on another conventional wiring board.

Next, one embodiment of a wiring board according to a third aspect of the present invention will be described with reference to FIGS. 5 and 6. FIG. 5 is a cross-sectional view schematically showing a wiring board 10c, and FIG. 6 is an enlarged, cross-sectional view showing a set of a solder bump and a semiconductor element connection pad on the wiring board shown in FIG. 5. The same constituent elements in the wiring board 10c shown in FIGS. 5 and 6 as those in the wiring boards 10a and 10b shown in FIGS. 1 to 4 are designated by the same reference characters, and therefore, their description will be omitted.

The wiring board 10c is basically similar to the wiring board 10b shown in FIGS. 3 and 4 except that a thin film resistor layer 3a covers the side surface of a main conductor layer 3b and a covering layer 3c covers the entire main surface of the thin film resistor layer 3a, and further, that a solder resist layer 9 is formed on each of outermost insulating layers 1b. The solder resist layer 9 contains a thermosetting resin having photosensitivity such as an acrylic denatured epoxy resin. The solder resist layer 9 has a thickness of about 10 μm to 30 μm, and further, includes an opening 9a for allowing a semiconductor element connection pad 3 to be exposed to the outside and an opening 9b for allowing an external connection pad 4 to be exposed to the outside. This protects an outermost wiring conductor 2, and further, enables the semiconductor element connection pad 3 and the external connection pad 4 to be connected to a semiconductor element S and an external electric circuit board via the openings 9a and 9b.

A resin paste or a resin film having photosensitivity is applied or stuck to the surface of the uppermost and lowermost insulating layers 1b, and further, a pattern having the openings 9a and 9b is exposed to light and developed by photolithography, followed by ultraviolet curing and thermosetting, thus forming the above-described solder resist layer 9.

In the wiring board 10c shown in FIG. 5, the semiconductor element connection pad 3 is formed of a part of the wiring conductor 2 formed on the uppermost insulating layer 1b. In other words, the semiconductor element connection pad 3 is exposed inward of the opening 9a, to be thus formed. The opening 9a is formed into a circle having a diameter of about 50 μm to 150 μm. As shown in FIG. 6, the main conductor layer 3b, the thin film resistor layer 3a, and the covering layer 3c are sequentially laminated in the semiconductor element connection pad 3 in such a manner as to be electrically connected in series to each other. The thin film resistor layer 3a is formed in such a manner as to cover a main surface 3b1 and a side surface 3b2 of the main conductor layer 3b and expose a side surface 3a2 of the thin film resistor layer 3a from the covering layer 3c.

The wiring board 10c is different from the wiring board 10b in that the thin film resistor layer 3a covers the side surface of the main conductor layer 3b and the covering layer 3c covers the entire main surface of the thin film resistor layer 3a. In the wiring board 10c, the entire main and side surfaces of the main conductor layer 3b are covered with, for example, a germanium thin film in a thickness of 100 nm to 1000 nm by well-known sputtering or vapor deposition, thereby forming the thin film resistor layer 3a. The covering layer 3c may be formed by the following method, for example. In the case where the covering layer 3c is formed of, for example, copper, the side surface 3a2 of the thin film resistor layer 3a is masked. Subsequently, the main surface of the thin film resistor layer 3a exposed from the mask is covered with a copper thin film in a thickness of about 0.05 μm to 0.5 μm by well-known sputtering, followed by depositing an electrolytic copper-plated layer on the thin film.

Since the other descriptions of the thin film resistor layer 3a, the main conductor layer 3b, and the covering layer 3c have been already made, they will be omitted here. The thin film resistor layer 3a formed in the wiring board according to the third aspect of the present invention has a low soldering wettability.

In the wiring board 10c shown in FIG. 5, the external connection pad 4 is formed of a part of the wiring conductor 2 formed on the lowermost insulating layer 1b. In other words, the external connection pad 4 is exposed inward of the opening 9b, to be thus formed. The opening 9b is formed into a circle having a diameter of about 200 μm to 700 μm.

With the above-described configuration, in the wiring board 10c according to the third aspect of the present invention, the semiconductor element connection pad 3 includes, at the surface of the insulating layer 1b, the main conductor layer 3b containing the low resistance material, the thin film resistor layer 3a containing the high resistance material and having a low soldering wettability, and the covering layer 3c having a high soldering wettability, wherein they are electrically connected in series to each other. Moreover, the thin film resistor layer 3a covers the main surface 3b1 and side surface 3b2 of the main conductor layer 3b, and further, the side surface 3a2 of the thin film resistor layer 3a is formed in such a manner as to be exposed from the covering layer 3c. Thus, even in the case where the thin film resistor layer 3a formed between the main conductor layer 3b and the covering layer 3c is as thin as 100 nm to 1000 nm, the thin film resistor layer 3a covers the main surface 3b1 and side surface 3b2 of the main conductor layer 3b, and therefore, it is possible to prevent the occurrence of short-circuiting between the main conductor layer 3b and the covering layer 3c.

Consequently, a damping resistance provided by the thin film resistor layer 3a electrically connected in series to the main conductor layer 3b can effectively act, so that it is possible to damp noise caused by the difference in characteristic impedance between the wiring conductor 2 and the semiconductor element S even in the case where a high-speed signal is transmitted to or received from the semiconductor element S through the wiring conductor for a signal out of the wiring conductors 2. Thus, it is possible to provide the wiring board 10c capable of normally actuating the semiconductor element S.

Moreover, the side surface 3a2 of the thin film resistor layer 3a having a low soldering wettability is exposed from the covering layer 3c, and therefore, it is possible to suppress the flow of a solder bump 5 over other portions from the covering layer 3c, thus preventing short-circuiting between the adjacent semiconductor element connection pads 3.

Incidentally, the present invention is not limited to the above-described embodiments, and therefore, it may be variously modified within the scope of the present invention. For example, although the damping resistance is provided at the semiconductor element connection pad 3 connected to the electrode T of the semiconductor element S in the wiring board 10a according to the first aspect and the wiring board 10b according to the second aspect, a damping resistance having a laminate configuration similar to that of the semiconductor element connection pad 3 may be disposed at the external connection pad 4 connected to the external electric circuit board. Alternatively, a damping resistance having a laminate configuration similar to that of the semiconductor element connection pad 3 may be disposed at the connection pad formed on the lower insulating layer 1b connected to the wiring conductor 2 formed on the upper insulating layer 1b or the core layer 1a.

Although no solder resist layer is formed on the outermost insulating layer 1b in the above-described embodiments, a solder resist layer may be formed on at least one of the outermost insulating layers 1b. In addition, although the connection pad 3 is constituted of the thin film resistor layer 3a in the wiring board 10a according to the first aspect, a covering layer having a high soldering wettability may be formed on the thin film resistor layer 3a. It is preferable that the covering layer contains a low resistance material such as copper excellent in wettability with solder, nickel, gold, or palladium in a thickness of about 1 μm to 10 μm.

Although the damping resistance is provided at the semiconductor element connection pad 3 connected to the electrode T of the semiconductor element S in the wiring board 10c according to the third aspect, a damping resistance having a laminate configuration similar to that of the semiconductor element connection pad 3 may be disposed on the external connection pad 4 connected to the external electric circuit board. Furthermore, although the solder resist layer is formed on the outermost insulating layer 1b in the wiring board 10c according to the third aspect, the solder resist layer may not be formed.

What is claimed is:

1. A wiring board comprising:
    an insulating board having an insulating layer at a surface thereof; and
    a connection pad formed at a surface of the insulating layer, wherein the connection pad includes
        a main conductor layer formed of a low resistance material having a volume resistivity of 100 μΩ·cm or less,
        a thin film resistor layer formed of a high resistance material having a volume resistivity of 10 Ω·cm or more and having a low soldering wettability, and
        a covering layer having a high soldering wettability,
        the main conductor layer, the thin film resistor layer, and the covering layer being sequentially laminated at the surface of the insulating layer in such a manner as to be electrically connected in series to each other, and
    the thin film resistor layer covers a main surface and a side surface of the main conductor layer, and further, a side surface of the thin film resistor layer is exposed from the covering layer.

2. The wiring board according to claim 1, wherein the main conductor layer is formed of copper.

3. The wiring board according to claim 1, wherein the thin film resistor layer is formed of germanium.

* * * * *